(12) United States Patent
Takeda et al.

(10) Patent No.: US 6,194,480 B1
(45) Date of Patent: Feb. 27, 2001

(54) PIGMENT COMPOSITION AND COLORED PHOTOSENSITIVE COMPOSITION

(75) Inventors: Akihiko Takeda; Shinichiro Morimoto; Kousaku Yoshimura, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/058,221

(22) Filed: Apr. 10, 1998

(30) Foreign Application Priority Data

Apr. 10, 1997 (JP) .................................................. 9-110338
May 30, 1997 (JP) .................................................. 9-157699

(51) Int. Cl.$^7$ .................................................. C08F 2/48
(52) U.S. Cl. .................. 522/75; 522/81; 522/84; 522/100; 522/102; 522/175; 522/110; 522/112; 522/136; 523/200; 523/204; 523/106; 523/300; 106/31.6; 106/31.85; 427/514; 427/517
(58) Field of Search .................. 522/75, 110, 100, 522/102, 112, 175, 136, 81, 84; 427/514, 517; 523/200, 204, 160, 300; 106/31.6, 31.85

(56) References Cited

U.S. PATENT DOCUMENTS

| | | | |
|---|---|---|---|
| 3,968,319 | * 7/1976 | Mani et al. ..................... | 428/511 |
| 4,839,414 | * 6/1989 | Bederke et al. ................. | 524/507 |
| 5,118,443 | * 6/1992 | Saito et al. ..................... | 252/311 |
| 5,164,001 | * 11/1992 | Saito et al. ..................... | 523/121 |
| 5,204,190 | * 4/1993 | Saito et al. ..................... | 428/531 |
| 5,322,762 | * 6/1994 | Kushi et al. .................... | 430/288 |
| 5,362,603 | * 11/1994 | Katoh et al. .................... | 430/281 |
| 5,476,544 | * 12/1995 | Endo et al. ..................... | 106/499 |

FOREIGN PATENT DOCUMENTS

| | | |
|---|---|---|
| 57-121013 | * 7/1982 | (JP) . |
| 60-80857 | * 5/1985 | (JP) . |
| 8-152714 | * 6/1996 | (JP) . |

OTHER PUBLICATIONS

Derwent Abstract #1982 7509E for JP57121013.*

* cited by examiner

Primary Examiner—James J. Seidleck
Assistant Examiner—Sanza L. McClendon

(57) ABSTRACT

A colored photosensitive composition is composed of a pigment composition, a binder polymer having an acidic group, a multi-functional monomer having at least two ethylenic unsaturated double bonds, and a photopolymerization initiator. The pigment composition is composed of an organic pigment, a dispersant, and an organic solvent. The dispersant is a copolymer of a polymerizable oligomer having an ethylenic unsaturated double bond in its terminal position and one or more monomers at least one of which has a nitrogen-containing group and an ethylenic unsaturated double bond.

9 Claims, 1 Drawing Sheet

PIGMENT COMPOSITION AND COLORED PHOTOSENSITIVE COMPOSITION

FIELD OF THE INVENTION

The present invention relates to a novel copolymer which is advantageously employable as a dispersant for dispersing a pigment in a solvent or a binder solution. The invention further relates a pigment-dispersing composition and a colored photosensitive composition which show good pigment-dispersibility, good fluidity and good coloring power. The pigment composition and the colored photosensitive composition of the invention are advantageously employable as coating materials, printing inks and materials for manufacturing color display units. Particularly, the colored photosensitive composition is favorably employable for forming a multi-color image on a substrate (e.g., color proof) and for preparing a color filter of a liquid crystal color display unit.

BACKGROUND OF THE INVENTION

A practically important pigment, which shows bright color tone and has high coloring power, generally is in the form of very fine particles. If the particle size is made to be much smaller so as to enhance the coloring power, however, the pigment dispersion liquid often exhibits such high viscosity that some troubles are apt to be caused in its industrial production process, that is, the dispersion liquid may hardly flow out of a dispersing apparatus, and it sometimes is impossible to transport the dispersion liquid through pipe lines. Further, the pigment dispersion liquid having such high viscosity may turn into gel in the course of storage.

A colored photosensitive composition containing the pigment is useful, for instance, as an image-forming material for producing color proofs or color filters. The pigment contained in the colored photosensitive composition is required to exhibit bright color tone and to show high coloring power.

In the process for forming a color image using the colored photosensitive composition, the composition is coated on a substrate to form a colored photosensitive layer, and then exposed through a predetermined pattern and developed. As the developer used in the developing procedure, an aqueous alkaline solution is more frequently employed than an organic solvent in consideration of environmental preservation. Hence, the unexposed photosensitive layer is required to be soluble in the aqueous alkaline solution. On the other hand, an organic solvent is advantageously used as a solvent (i.e., dispersing medium) of the coating liquid containing the colored photosensitive composition because the coating liquid in the organic solvent is easily dried. Therefore, a binder contained in the composition is generally required not only to have an acidic group but also to be soluble in an appropriate organic solvent, and in fact the conventional colored photosensitive composition comprises organic pigment particles dispersed in the binder having an acidic group.

Since the layer of a colored photosensitive composition is generally required to be very thin and to have high coloring power, the organic pigment must be very finely dispersed in the binder (which has an acidic group and further which is soluble in an organic solvent). As described hereinbefore, the colored photosensitive composition (i.e., a pigment dispersed photosensitive composition) is useful, for example, as a material for forming a color filter of a liquid crystal display unit.

The color filter comprises red, green, and blue colorants on a transparent substrate in the positions of respective pixels so that light can selectively pass through the pixels to display the desired color image. In the process for producing the filter, the colorants are placed on the substrate by various methods such as dyeing method, printing method, electrodeposition method, and pigment dispersion method. The pigment dispersion method is most preferred because the production process is reliable and it gives a color filter of high quality.

The pigment dispersion method comprises the steps of coating the transparent substrate with the colored photosensitive liquid composition containing the pigment composition to form a colored photosensitive layer; pattern-wise exposing the layer; developing in a developing solution the layer to form a pixel pattern of the first color, and then repeating those steps for each color to prepare a plural number of color image patterns each consisting of a large number of pixels. Since the colorant is a solid pigment in the form of fine particles (which is insoluble in ordinary solvents such as organic solvents) in this method, the pigment particles may scatter or absorb the applied light to lower the transparency of the filter if the particle size is large. Further, in that case, the axis of polarized light may be rotated by scattering and/or birefringence, and consequently the contrast of an image given by the liquid crystal display unit may lower (ref., "Seventh Color Optics Conference (1990)", a color filter for 10.4" size TFT-LCD display of 512 colors, Ueki, Koseki, Fukunaga and Yamanaka). Hence, the pigment particles are desired to be dispersed finely and uniformly enough and it is requried for the particle size to be appropriately small.

In order to make the pigment particles well dispersed and to give good fluidity to the pigment dispersion liquid, various kinds of dispersants are developed. Generally used dispersants can be roughly classified into two types, namely, a polymer type and a low molecular weight type. Examples of the polymer type dispersants include polyacrylate, sodium maleate-olefin copolymer, polyester having carboxyl terminal (Japanese Patent Publication No. 54-34009), a polyester having an acidic group and/or basic group derived from tetrakis (2-hydroxy-alkyl)ethylenediamine (Japanese Patent Provisional Publication No. H2-245231), and a copolymer derived from the following four kinds of monomer, namely, a macromonomer (i.e., an oligomer having an ethylenic unsaturated group in its terminal position), a monomer having a hydroxyl group, a monomer having a carboxyl group and other monomer (Japanese Patent Provisional Publication No. H8-259876). Examples of the low molecular weight type dispersants include a sorbitan fatty acid ester, a poly-oxyethylenealkylamine, an alkyldiamine and an alkanol amine derivative (U.S. Pat. No. 3,536,510).

The copolymer derived from a macromonomer and others is said to be useful for preparing a colored photosensitive composition for color filter or color proof. Japanese Patent Provisional Publication No. H8-259876 discloses that the above-mentioned copolymer (which is derived from a macromonomer and others) makes the pigment particle size small enough and improves dispersing stability.

The present inventors have examined known colored photosensitive compositions and found that there are the following problems in the known compositions. In the case that organic pigment particles are dispersed in the binder which has an acidic group and is soluble in an organic solvent, the dispersion liquid is apt to show a high viscosity because of certain intermolecular interaction between the acidic group and the organic pigment particle. The viscous dispersion liquid is not preferred in consideration of dispersion of the pigment particles although the dispersion stability is enhanced, and hence more appropriate dispersant is needed so as to control the viscosity and to promote good dispersion of the particles. Among the above-described known lower molecular weight type dispersants, amine compounds are found to be relatively effective to promote the dispersion. However, since the amine compound easily reacts with the acidic group of the binder to form a salt, it sometimes causes some troubles in the developing procedure (for example, the photosensitive resin layer may turns to show less solubility in an aqueous alkaline developing solution). Further, it has been found that the known water-soluble dispersants and various alkaline dispersants have the same problem as the above-mentioned amine compound.

SUMMARY OF THE INVENTION

The inventors have further examined the dispersant which is the copolymer derived from four kinds of reactive compounds, that is, a macromonomer (which is an oligomer having an ethylenic unsaturated group at the terminal position), a monomer having hydroxyl group, a monomer having carboxyl group and other monomer(s) (Japanese Patent Provisional Publication No. H8-259876). In the case using the above-mentioned copolymer, the obtained dispersion liquid is not as viscous as that employing a known polymer type dispersant. However, the copolymer does not satisfactory promote dispersion of the fine particles, and consequently the particles are apt to be insufficiently dispersed in the liquid. The inventors have studied why the viscosity increase is relatively low when this copolymer is employed, and concluded that certain steric hindrance of the polymer chain derived from the macromonomer favorably works to keep the viscosity at a raltively low level. As a result, the inventors have produced a variety of copolymers using the macromonomer and other monomers and studied their characteristics as dispersants.

It is an object of the present invention to provide a pigment dispersion composition having excellent characteristics such as good dispersion stability, good fluidity, high transparency, and good coloring power.

It is another object of the invention to provide a colored photosensitive composition which shows a high coloring power and is hardly disturbed in the developing step using an aqueous alkaline developing solution.

Furthermore, it is an object of the invention to provide a new copolymer which makes pigment particles finely dispersed in a binder polymer solution and which gives improved stability to the finely dispersed particles.

The present invention resides in a pigment composition comprising an organic pigment, a dispersant, and an organic solvent, wherein the dispersant is a copolymer of a polymerizable oligomer having an ethylenic unsaturated double bond in its terminal position and one or more monomers at least one of which has a nitrogen-containing group and an ethylenic unsaturated double bond.

In the pigment composition of the invention, preferred are the following embodiments:

1) The copolymer comprises repeating units derived from the polymerizable oligomer in an amount of 20 to 99 wt. % (based on the total repeating units), and repeating units derived from the monomer or monomers in an amount of 1 to 40 wt. % (based on the total repeating units).

2) The copolymer is a copolymer of a polymerizable oligomer having an ethylenic unsaturated double bond in its terminal position and two or more monomers at least one of which has both a nitrogen-containing group and an ethylenic unsaturated double bond and other of which has an ethylenic unsaturated double bond but having no nitrogen-containing group.

3) The polymerizable oligomer is a poly(alkyl acrylate), a copolymer of alkyl acrylate and a copolymerizable monomer, a poly(alkyl methacrylate), a copolymer of an alkyl methacrylate and a copolymerizable monomer, or polystyrene, any of which has a number average molecular weight of 1,000 to 10,000 and has an acryloyl or methacryloyl group in its terminal position.

4) The monomer having a nitrogen-containing group and an ethylenic unsaturated double bond is a compound of the following formula (1):

in which

$R^{11}$ represents hydrogen atom or methyl group;

$R^{12}$ represents an alkylene group of 1 to 8 carbon atoms;

$X^1$ represents $-N(R^{13})(R^{14})$ in which each of $R^{13}$ and $R^{14}$ independently is hydrogen atom, an alkyl group of 1 to 6 carbon atoms, or phenyl group; $-R^{15}-N(R^{16})(R^{17})$ in which $R^{15}$ is an alkylene group of 1 to 6 carbon atoms and each of $R^{16}$ and $R^{17}$ independently represents hydrogen atom, an alkyl group of 1 to 6 carbon atoms, or phenyl group; or a heterocyclic group such as pyrrolidino group, pyrrolidyl group, pyridyl group, piperidino group, or morpholino group; and each of m and n independently represents 0 or 1.

5) The monomer having a nitrogen-containing group and an ethylenic unsaturated double bond is a compound of the following formula (2):

in which $R^{21}$, $R^{22}$ and $X^2$ have the same meaning as $R^{11}$, $R^{12}$ and $X^1$ of the formula (1), respectively.

6) The monomer having a nitrogen-containing group and an ethylenic unsaturated double bond is a compound of the following formula (3):

in which $R^{31}$ and $X^3$ have the same meaning as $R^{11}$ and $X^1$ of the formula (1), respectively ($X^3$ preferably represents $-N(R^{33})(R^{34})$ in which $R^{32}$ and $R^{34}$ have the same meansing as $R^{13}$ and $R^{14}$ of the formula (1), respectively; and also $X^3$ preferably represents $-R^{35}-N(R^{36})(R^{37})$ in which $R^{35}$, $R^{36}$ and $R^{37}$ have the same meaning as $R^{15}$, $R^{16}$ and $R^{17}$ of the formula (1), respectively.

7) The monomer having a nitrogen-containing group and an ethylenic unsaturated double bond is a compound of the following formula (4):

(4)

in which $R^{41}$ has the same meaning as $R^{11}$ of the formula (1); and $X^4$ is pyrrolidino group, pyrrolidyl group, pyridyl group, piperidino group, or morpholino group.

8) The pigment composition further comprises a binder polymer having an acidic group.

9) The organic pigment is a yellow pigment.

10) The organic pigment has an acidic group.

The present invention also resides in a colored photosensitive composition which comprises a pigment composition, a binder polymer having an acidic group, a multi-functional monomer having at least two ethylenic unsaturated double bonds, and a photopolymerization initiator, in which the pigment composition comprises an organic pigment, a dispersant, and an organic solvent, wherein the dispersant is a copolymer of a polymerizable oligomer having an ethylenic unsaturated double bond in its terminal position and one or more monomers at least one of which has a nitrogen-containing group and an ethylenic unsaturated double bond.

The invention further resides in a novel copolymer of a polymerizable oligomer and one or more monomers wherein the polymerizable oligomer is a poly(alkyl acrylate), a copolymer of an alkyl acrylate and a copolymerizable monomer, a poly(alkyl methacrylate), a copolymer of an alkyl methacrylate and a copolymerizable monomer, or polystyrene, any of which has a number average molecular weight of 1,000 to 10,000 and has an acryloyl or methacryloyl group in its terminal position; and at least one monomer is a compound of the following formula (1):

(1)

in which $R^{11}$ is hydrogen atom or methyl group;

$R^{12}$ is an alkylene group of 1 to 8 carbon atoms;

$X^1$ is $-N(R^{13})(R^{14})$ in which each of $R^{13}$ and $R^{14}$ independently is hydrogen atom, an alkyl group of 1 to 6 carbon atoms, or phenyl group; $-R^{15}-N(R^{16})(R^{17})$ in which $R^{15}$ is an alkylene group of 1 to 6 carbon atoms and each of $R^{16}$ and $R^{17}$ independently represents hydrogen atom, an alkyl group of 1 to 6 carbon atoms, or phenyl group; or a heterocyclic group such as pyrrolidino group, pyrrolidyl group, pyridyl group, piperidino group, or morpholino group; and each of m and n independently represents 0 or 1.

The copolymer preferably comprises repeating units derived from the polymerizable oligomer in an amount of 20 to 99 wt. % of the total repeating units, and repeating units derived from the one or more monomers in an amount of 1 to 40 wt. % of the total repeating units.

The polymerizable oligomer preferably has a number average molecular weight of 2,000 to 9,000, and the copolymer preferably has a weight average molecular weight of 3,000 to 100,000.

The polymerizable oligomer preferably is a polymer represented by the following formula (5):

(5)

in which each of $R^{51}$ and $R^{53}$ independently represents hydrogen atom or methyl group; $R^{52}$ is an alkylene group of 1 to 8 (preferably, 2 to 4) carbon atoms; Y represents phenyl group or a phenylalkyl group whose alkyl group has 1 to 4 carbon atoms; or Y represents $-COOR^{54}$ in which $R^{54}$ is an alkyl group of 1 to 6 carbon atoms, phenyl group or an arylalkyl group of 7 to 10 carbon atoms; and q is an integer of 20 to 200.

The colored photosensitive composition is advantageously employable for performing a image forming method comprising the steps of coating a substrate with the organic solution of the composition; drying the coated solution to form a colored photosensitive layer; making the layer imagewise exposed, and then developed. Further, it can be also advantageously employed for the image forming method comprising the steps of preparing the photosensitive image transfer sheet having a layer of the photosensitive composition thereon; transferring the layer of the photosensitive composition onto a substrate; making the transferred layer imagewise exposed, and then developed. In those processes, a colored photosensitive composition can be advantageously employed for preparing color filters or color proofs.

DETAILED DESCRIPTION OF THE INVENTION

The pigment-dispersing composition of the invention comprises an organic solvent, an organic pigment, and a copolymer derived from a polymerizable oligomer having an ethylenic unsaturated double bond at its terminal (hereinafter, the polymerizable oligomer is referred to as "macromonomer") and a monomer having a nitrogen-containing group as well as an ethylenic unsaturated double bond. In addition to the pigment dispersion composition, the colored photosensitive composition of the invention further comprises a binder polymer having an acidic group, a multi-functional monomer having at least two ethylenic unsaturated double bonds, and a photopolymerization initiator.

Figure 1:
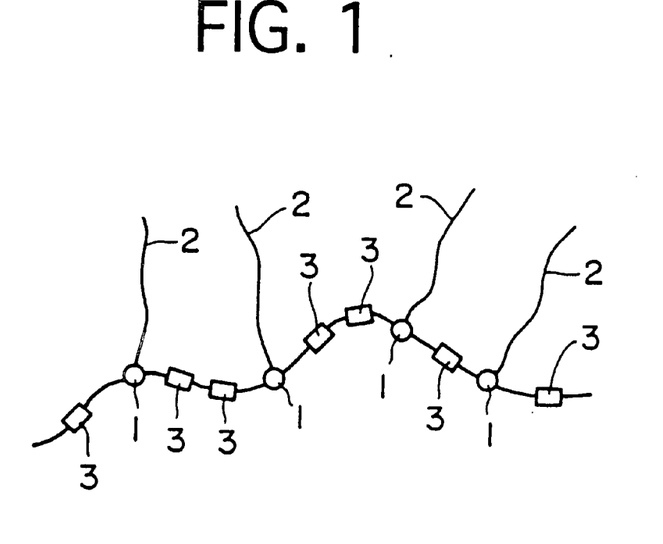
FIG. 1 is a schematic view showing a structure of the copolymer of the invention.

The above-mentioned copolymer can be produced by copolymerization reaction between the ethylenic unsaturated double bond at the terminal of the macromonomer and the double bond of the monomer having a nitrogen-containing group, and hence the copolymer has the structure, for example, shown in FIG. 1.

In FIG. 1, the numeral 1 indicates a part corresponding to the ethylenic unsaturated double bond of the macromonomer (ethylenic unsaturated double bond is changed to a single bond in the course of copolymerization, and hence 1 is a single bond). The numeral 2 indicates a polymer chain of the macromonomer connecting to the numeral 1. The numeral 3 indicates the monomer unit derived from the monomer having a nitrogen-containing group, and is formed by copolymerization between the macromonomer and the monomer.

Figure 2:
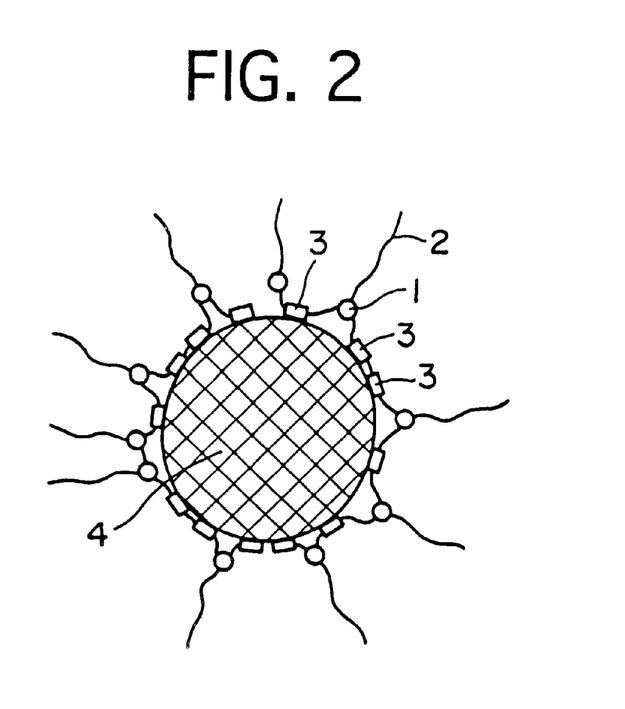
FIG. 2 is a schematic view showing the copolymer of the invention adsorbed on the surface of a pigment particle.

FIG. 2 schematically shows the copolymer attached to a pigment particle. The nitrogen atom in the nitrogen-containing group of each monomer unit 3 is attached to the surface of the organic pigment particle 4, and the polymer chains 2 of the macromonomers are stuck out of the surface to cover the particle 4.

As described above, in the case that the pigment-dispersing composition is used for the preparation of a photosensitive composition, the acidic group contained in the binder polymer and the nitrogen-containing group often interact strongly with each other or react with each other to form a salt. However, the polymer chains 2 inhibit this undesirable behavior, improve the dispersion stability, and enhance the dispersibility by the aid of the nitrogen-containing group. Consequently, the copolymer of the invention raises the viscosity at only a small degree while a known polymer-type dispersant having a nitrogen-containing group often makes the dispersion liquid too viscous, and further the copolymer of the invention promotes the dispersion of the organic pigment particles in the binder solution. Particularly, it remarkably enhances the dispersion of an acidic organic pigment such as a yellow pigment.

The polymerizable oligomer having an ethylenic unsaturated double bond in its terminal position (namely, macromonomer) consists essentially of a polymer chain and the group having the ethylenic unsaturated double bond at the terminal of the chain. Preferably, the macromonomer has the group having the ethylenic unsaturated double bond at only one of the terminals of the polymer chain. The polymerizable oligomer preferably has a number average molecular weight Mn (converted to that of polystyrene) of 1,000 to 10,000, more preferably 2,000 to 9,000.

The above polymer chain is generally a homopolymer or a copolymer derived from at least one selected from the group consisting of an alkyl (meth)acrylate, styrene, acrylonitrile, vinyl acetate, and butadiene. Preferred is a homopolymer or a copolymer derived from an alkyl acrylate, an alkyl methacrylate and/or polystyrene.

Preferred examples of the groups having the ethylenic unsaturated double bond include (meth)acryloyl group and vinyl group. Particularly preferred is acryloyl or methacryloyl group.

Preferably, the above polymerizable oligomer is an oligomer represented by the following formula (5):

(5)

in which each of $R^{51}$ and $R^{53}$ independently represents hydrogen atom or methyl group; $R^{52}$ is an alkylene group of 1 to 8 (preferably 2 to 4, more preferably 2) carbon atoms; Y represents phenyl group or a phenylalkyl group whose alkyl group has 1 to 4 carbon atoms; or Y represents —COOR$^{54}$ in which R$^{54}$ is an alkyl group of 1 to 6 carbon atoms, phenyl group or an arylalkyl group of 7 to 10 carbon atoms; and q is an integer of 20–200. Preferably, Y represents phenyl group or —COOR$^{54}$ in which R$^{54}$ is an alkyl group of 1 to 4 carbon atoms.

Preferred examples of the polymerizable oligomers (i.e., macromonomers) include styrene polymer, polymethyl (meth)acrylate, poly-n-butyl (meth)acrylate, and poly-isobutyl (meth)acrylate, each of which has (meth)acryloyl group in one terminal position. Examples of the commercially available polymerizable oligomers include a polystyrene oligomer having methacryloyl group in one terminal position (Mn: 6,000; AS-6 (trade name), available from Toa Gosei Kagaku Kogyo Co., Ltd.), polymethyl methacrylate oligomer having methacryloyl group in one terminal position (Mn: 6,000; AA-6 (trade name), available from Toa Gosei Kagaku Kogyo Co., Ltd.), and poly-n-butyl acrylate oligomer having methacryloyl group in one terminal position (Mn: 6,000; AB-6 (trade name), available from Toa Gosei Kagaku Kogyo Co., Ltd.).

Preferably, the above monomer having a nitrogen-containing group and an ethylenic unsaturated double bond is a compound of the aforementioned formula (1).

More preferably, the above monomer is a compound of any of the aforementioned formulas (2) to (4).

In the formula, the following is preferred.

$R^{12}$ is an alkylene group of 1–6 (more preferably 2–3) carbon atoms; $X^1$ is —N($R^{13}$) ($R^{14}$) in which each of $R^{13}$ and $R^{14}$ independently represents hydrogen atom, an alkyl group of 1–4 carbon atoms, or phenyl group; or $X^1$ represents —R$^{15}$—N($R^{16}$) ($R^{17}$) in which $R^{15}$ is an alkylene group of 2–6 carbon atoms and each of $R^{16}$ and $R^{17}$ independently represents an alkyl group of 1–4 carbon atoms; or $X^1$ is pyrrolidino group, pyrrolidyl group (particularly, 2-pyrrolidyl group), pyridyl group (particularly, 1-pyridyl group, 2-pyridyl group), piperidino group (particularly, 1-piperidino group), or morpholino group (particularly, 4-morpholino group).

Particularly preferred monomers are compounds of the formulas (2) and (3), which correspond to the case of m=1 and n=1 and the case of m=1 and n=0 in the formula (1), respectively.

Preferred examples of the compounds of the formula (1) include (meth)acrylates such as N,N-dimethylamino-ethyl (meth)acrylate, N,N-dimethylaminopropyl (meth)-acrylate, 1-(N,N-dimethylamino)-1,1-dimethylmethyl (meth) acrylate, N,N-dimethylaminohexyl (meth)acrylate, N,N-diethylaminoethyl (meth)acrylate, N,N-diisopropyl-aminoethyl (meth)acrylate, N,N-di-n-butylaminoethyl (meth)acrylate, N,N-di-isobutylaminoethyl (meth)acrylate, morpholinoethyl (meth)acrylate, piperidinoethyl (meth)-acrylate, 1-pyrrolidinoethyl (meth)acrylate, N,N-methyl-2-pyrrolidylaminoethyl (meth)acrylate, and N,N-methyl-phenylaminoethyl (meth)acrylate; (meth)acrylamides such as dimethyl (meth)acrylamide, diethyl (meth)acrylamide, diisopropyl (meth)acrylamide, di-n-butyl (meth)acrylamide, diisobutyl (meth)acrylamide, morpholino (meth)-acrylamide, piperidino (meth)acrylamide, N-methyl-2-pyrrolidyl (meth)acrylamide and N,N-methylphenyl (meth)-acrylamide; aminoalkyl (meth)acrylamides such as 2-(N,N-dimethylamino)ethyl (meth)acrylamide, 2-(N,N-diethyl-amino)ethyl (meth)acrylamide, 3-(N,N-diethylamino)propyl (meth)acrylamide, 3-(N,N-dimethylamino)propyl (meth)-acrylamide, 1-(N,N-dimethylamino)-1,1-dimethylmethyl (meth)acrylamide, and 6-(N,N-diethylamino)hexyl (meth)-acrylamide; and vinylpyridine.

It is also preferred that the copolymer of the invention is derived from the above-mentioned polymerizable oligomer, the above monomer, and another monomer copolymerizable with them. Examples of the monomers copolymerizable with the above-mentioned oligomer and monomer include unsaturated carboxylic acid (e.g., (meth)acrylic acid, crotonic acid, itaconic acid, maleic acid and fumaric acid); aromatic vinyl compound (e.g., styrene, α-methylstyrene and vinyltoluene); (meth)acrylic acid alkyl ester (e.g., methyl (meth)acrylate, ethyl (meth)acrylate, n-butyl (meth) acrylate and isobutyl (meth)acrylate); (meth)acrylic acid alkylaryl ester (e.g., benzyl (meth)-acrylate); glycidyl (meth)acrylate; carboxylic acid vinyl ester (e.g., vinyl acetate and vinyl propionate); vinyl cyanide (e.g., (meth) acrylonitrile and α-chloroacrylo-nitrile); and aliphatic conjugated diene (e.g., 1,3 -butadiene and isoprene). Among the above monomers, unsaturated carboxylic acid, (meth)acrylic acid alkyl ester, (meth)acrylic acid alkylaryl ester and carboxylic acid vinyl ester are preferred.

The copolymer of the invention can be derived from the above-mentioned polymerizable oligomer (macromonomer) and the above-mentioned monomer having a nitrogen-containing group. Further, the copolymer of the invention may be also derived from the polymerizable oligomer, the monomer having a nitrogen-containing group, and the monomer having no nitrogen-containing group but having an ethylenic unsaturated double bond with which the monomer can be copolymerized with the above-mentioned oligomer (i.e., macromonomer) and monomer (which has a nitrogen-containing group).

The copolymer preferably comprises repeating units derived from the polymerizable oligomer in an amount of 20 to 99 wt. % (particularly 20 to 80 wt. %) of the total repeating units, and repeating units derived from the monomer having a nitrogen-containing group in an amount of 1 to 40 wt. % (particularly 5 to 30 wt. %) of the total repeating units. In the case that the copolymer is derived from the above-mentioned oligomer, the monomer having a nitrogen-containing group and the monomer copolymerizable with them, the copolymer preferably comprises repeating units derived from the copolymerizable monomer in an amount of 5 to 70 wt. % of the total repeating units.

The copolymer preferably has a weight average molecular weight (Mw) of 3,000 to 100,000 (more preferably, 5,000 to 50,000, in terms of Mw of polystyrene). The weight average molecular weight here is a value converted to that of polystyrene, and is determined by means of gel permeation chromatography (carrier: tetrahydrofuran).

Concrete examples of the copolymer are as follows:
(1) copolymer of dimethylaminoethyl acrylate/poly(methyl methacrylate) having methacryloyl terminal,
(2) copolymer of diethylaminoethyl acrylate/poly(methyl methacrylate) having methacryloyl terminal,
(3) copolymer of di-n-butylaminoethyl acrylate/poly-(methyl methacrylate) having methacryloyl terminal,
(4) copolymer of di-isobutylaminoethyl acrylate/poly-(methyl methacrylate) having methacryloyl terminal,
(5) copolymer of dimethylaminoethyl acrylate/polystyrene having methacryloyl terminal,
(6) copolymer of dimethylaminoethyl acrylate/poly(methyl methacrylate) having methacryloyl terminal/benzyl methacrylate,
(7) copolymer of diethylaminoethyl acrylate/poly(methyl methacrylate) having methacryloyl terminal/benzyl methacrylate,
(8) copolymer of di-n-butylaminoethyl acrylate/poly-(methyl methacrylate) having methacryloyl terminal/benzyl methacrylate,
(9) copolymer of di-isobutylaminoethyl acrylate/poly-(methyl methacrylate) having methacryloyl terminal/benzyl methacrylate,
(10) copolymer of vinylpyridine/poly(methyl methacrylate) having methacryloyl terminal/benzyl methacrylate,
(11) copolymer of N,N-methyl-2-piperidylethyl acrylate/poly(methyl methacrylate) having methacryloyl terminal/benzyl methacrylate,
(12) copolymer of 1-piperidinoethyl acrylate/poly(methyl methacrylate) having methacryloyl terminal/benzyl methacrylate,
(13) copolymer of N,N-methylphenylaminoethyl acrylate/poly(methyl methacrylate) having methacryloyl terminal/benzyl methacrylate,
(14) copolymer of 4-morpholinoethyl acrylate/poly(methyl methacrylate) having methacryloyl terminal/benzyl methacrylate,
(15) copolymer of dimethylaminoethyl acrylate/polystyrene having methacryloyl terminal/benzyl methacrylate,
(16) copolymer of dimethylaminoethyl acrylate/polystyrene having methacryloyl terminal/methyl methacrylate,
(17) copolymer of dimethylaminoethyl acrylate/polystyrene having methacryloyl terminal/styrene,
(18) copolymer of 3-(N,N-dimethylamino)propyl acrylamide/poly(methyl methacrylate) having methacryloyl terminal,
(19) copolymer of 3-(N,N-dimethylamino)propyl acrylamide/polystyrene having methacryloyl terminal
(20) copolymer of 2-(N,N-dimethylamino)ethyl acrylamide/poly(methyl methacrylate) having methacryloyl terminal,
(21) copolymer of 2-(N,N-diethylamino)ethyl acrylamide/poly(methyl methacrylate) having methacryloyl terminal.

The copolymer can be formed by radical polymerization of the polymerizable oligomer, the monomer having a nitrogen-containing group, and optionally one or more other monomers copolymerizable with them. For the polymerization reaction in a solvent, a radical polymerization initiator is generally employed, and optionally a chain transfer agent (e.g., 2-mercaptoethanol and dodecylmercaptan) is also employed.

Synthesis examples of the copolymers of the invention are shown below.

[Synthesis example 1]

Fifteen weight parts of 1-methoxy-2-propyl acetate was placed in a three-necked distillation flask in nitrogen gas atmosphere. Under stirring by a three-one motor, the flask was heated to 78° C. in a stream of nitrogen gas.

Each of the monomer solution and the initiator solution consisting of the following components was independently prepared, and then the solutions were simultaneously placed dropwise to the flask for 135 minutes.

| (Components of monomer solution) | |
|---|---|
| Dimethylaminoethyl acrylate | 4.1 weight parts |
| Poly(methyl methacrylate) having methacryloyl group at one terminal [number average molecular weight: 6,000, MACROMONOMER AA-6 (trade name), available from Toa Gosei Kagaku Kogyo Co., Ltd.] | 25.9 weight parts |
| 1-Methoxy-2-propyl acetate | 45 weight parts |
| (Components of initiator solution) | |
| 2,2-Azobis(2,4-dimethylvaleronitrile) [V-65 (trade name), available from Wako Junyaku Co., Ltd.] | 0.04 weight part |
| 1-Methoxy-2-propyl acetate | 9.6 weight parts |

Subsequently, 0.08 weight part of 2,2-azobis(2,4-dimethylvaleronitrile) [V-65, trade name] was placed in the flask. The flask was kept at 78° C. for 3 hours, and then heated to 90° C. and kept the temperature for 30 minutes.

After that, the flask was cooled to room temperature to obtain a polymer solution. The obtained polymer solution contained a solid content of 30 wt. %, and the polymerization yield was 98%. The weight average molecular weight of the prepared copolymer was measured by means of gel permeation chromatography (C-R4A, Shimadzu Seisakusho Ltd.) and found to be 20,000.

[Synthesis example 2]

13.4 Weight parts of 1-methoxy-2-propyl acetate were placed in a three-necked distillation flask in nitrogen gas atmosphere. Under stirring by a three-one motor, the flask was heated to 78° C. in a stream of nitrogen gas.

Each of the monomer solution and the initiator solution consisting of the following components was independently prepared, and then the solutions were simultaneously placed dropwise in the flask for 135 minutes.

| (Components of monomer solution) | |
|---|---|
| Dimethylaminoethyl acrylate | 3.1 weight parts |
| Benzyl methacrylate | 17.2 weight parts |
| Poly(methyl methacrylate) having methacryloyl group at one terminal [number average molecular weight: 6,000, MACROMONOMER AA-6 (trade name), available from Toa Gosei Kagaku Kogyo Co., Ltd.] | 9.3 weight parts |
| 1-Methoxy-2-propylacetate | 45 weight parts |
| (Components of initiator solution) | |
| 2,2-Azobis(2,4-dimethylvaleronitrile) [V-65 (trade name), available from Wako Junyaku Co., Ltd.] | 0.16 weight part |
| 1-Methoxy-2-propyl acetate | 7.2 weight parts |

Subsequently, 0.32 weight part of 2,2-azobis(2,4-dimethylvaleronitrile) [V-65, trade name] was placed in the flask. The flask was kept at 78° C. for 3 hours, and then heated to 90° C. and kept the temperature for 30 minutes. After that, the flask was cooled to room temperature to obtain a polymer solution. The obtained polymer solution contained a solid content of 30 wt. % and the polymerization yield was 98%. The weight average molecular weight of the prepared copolymer was measured by means of gel permeation chromatography (C-R4A, Shimadzu Seisakusho Ltd.) and found to be 20,000.

[Synthesis example 3]

15.5 Weight parts of 1-methoxy-2-propyl acetate were placed in a three neck distillation flask under nitrogen gas atmosphere. Under stirring by a three-one motor, the flask was heated to 78° C. in a stream of nitrogen gas.

Each of the monomer solution and the initiator solution consisting of the following components was independently prepared, and then the solutions were simultaneously placed dropwise in the flask for 135 minutes.

| (Components of monomer solution) | |
|---|---|
| Dimethylaminoethyl acrylamide | 4.4 weight parts |
| Poly(methyl methacrylate) having methacryloyl group at one terminal [number average molecular weight: 6,000, MACROMONOMER AA-6 (trade name), available from Toa Gosei Kagaku Kogyo Co., Ltd.] | 25.6 weight parts |
| 1-Methoxy-2-propyl acetate | 45 weight parts |

| -continued | |
|---|---|
| (Components of initiator solution) | |
| 2,2-Azobis(2,4-dimethylvaleronitrile) [V-65 (trade name), available from Wako Junyaku Co., Ltd.] | 0.04 weight part |
| 1-Methoxy-2-propyl acetate | 9.5 weight parts |

Subsequently, 0.08 weight part of 2,2-azobis(2,4-dimethylvaleronitrile) [V-65 (trade name)] was placed in the flask. The flask was kept at 78° C. for 3 hours, and then heated to 90° C. and kept the temperature for 30 minutes. After that, the flask was cooled to room temperature to obtain a polymer solution. The obtained polymer solution contained a solid content of 30 wt. % and the polymerization yield was 98%. The weight average molecular weight of the prepared copolymer was measured by gel permeation chromatography (C-R4A, Shimadzu Seisakusho Ltd.) and found to be 20,000.

[Synthesis example 4]

15.5 Weight parts of 1-methoxy-2-propyl acetate were placed in a three neck distillation flask in nitrogen gas atmosphere. Under stirring by a three-one motor, the flask was heated to 78° C. in a stream of nitrogen gas.

Each of the monomer solution and the initiator solution consisting of the following components was independently prepared, and then the solutions were simultaneously placed dropwise in the flask for 135 minutes.

| (Components of monomer solution) | |
|---|---|
| 3-(N,N-Dimethylamino)propyl acrylamide | 4.1 weight parts |
| Poly(methyl methacrylate) having methacryloyl group at one terminal [number average molecular weight: 6,000, MACROMONOMER AA-6 (trade name), available from Toa Gosei Kagaku Kogyo Co., Ltd.] | 25.9 weight parts |
| 1-Methoxy-2-propyl acetate | 45 weight parts |
| (Components of initiator solution) | |
| 2,2-Azobis(2,4-dimethylvaleronitrile) [V-65 (trade name), available from Wako Junyaku Co., Ltd.] | 0.04 weight part |
| 1-Methoxy-2-propyl acetate | 9.5 weight parts |

Subsequently, 0.08 weight part of 2,2-azobis(2,4-dimethylvaleronitrile) [V-65, trade name] was placed in the flask. The flask was kept at 78° C. for 3 hours, and then heated to 90° C. and kept the temperature for 30 minutes. After that, the flask was cooled to room temperature to obtain a polymer solution. The obtained polymer solution contained a solid content of 30 wt. % and the polymerization yield was 98%. The weight average molecular weight of the prepared copolymer was measured by gel permeation chromatography (C-R4A, Shimadzu Seisakusho Ltd.) and found to be 20,000.

The copolymer (polymer dispersant) of the invention can be used singly or in combination with one or more of other known dispersants. When the copolymer is used with other dispersants, a weight ratio of the copolymer/known dispersants is generally in the range of 99/1 to 10/90, preferably 99/1 to 30/70. Examples of the known dispersants include amide compounds such as nonanoamide, decaneamide, dodecaneamide, N-dodecylhexadecaneamide, N-octadecylpropionamide, N,N-dimethyldodecaneamide, and N,N-dihexylacetamide; amine compounds such as diethylamine, diheptylamine, dibutylhexadecylamine, N,N,N',N'-tetramethylmethaneamine, triethylamine, tributylamine and trioctylamine; amine compounds having hydroxyl group such as monoethanolamine, diethanolamine, triethanolamine, N,N,N',N'-tetra(hydroxyethyl)-1,2-diaminoethane, N,N,N'-tri(hydroxyethyl)-1,2-diaminoethane, N,N,N',N'-tetra-(hydoxyethylpolyoxyethylene)-1,2-diaminoethane, 1,4-bis(2-hydroxyethyl)piperazine and 1-(2-hydroxyethyl)-piperazine; and other compounds such as nipecotamide, isonipecotamide and nicotinic acid amide. Examples of commercially available dispersants employable with the copolymer of the invention include SIGENOX 105 (trade name, available from Hakko Chemical Co., Ltd.).

It is also preferred for the copolymer (polymer dispersant) to be used in combination with one or more of amine compounds of the following formula (6) or (7):

In the formula (6), each of $R^{61}$ and $R^{62}$ independently represents hydrogen, an alkyl group which may have one or more substituent groups or an aralkyl group which may have one or more substituent groups, and $R^{61}$ and $R^{62}$ may be combined with each other to form a nitrogen-containing 5- or 6-membered saturated ring (which may further contain 1–3 heteroatoms selected from the group consisting of oxygen atom, sulfur atom or nitrogen atom); $R^{63}$ represents an alkylene group or an alkylene group having ether linkage therein; and X is one of the groups of —$CON(Y^{61})(Y^{62})$, —$OCON(Y^{61})(Y^{62})$ —$N(Y^{63})CO(Y^{64})$ and —$N(Y^{63})CON(Y^{61})(Y^{62})$ in which each of $Y^{61}$, $Y^{62}$, $Y^{63}$ and $Y^{64}$ independently represents hydrogen atom, an alkyl group which may have one or more substituent groups, an aralkyl group which may have one or more substituent groups, or an aryl group which may have one or more substituent groups.

In the formula (7), each of $R^{71}$, $R^{72}$, $R^{76}$ and $R^{77}$ independently represents hydrogen atom, an alkyl group which may have one or more substituent groups or an aralkyl group which may have one or more substituent groups. Each of $R^{71}$, $R^{72}$, $R^{76}$ and $R^{77}$ may independently be combined with each other to form a nitrogen-containing 5- or 6-membered saturated ring (which may further contain 1–3 hetero atoms selected from the group consisting of oxygen atom, sulfur atom or nitrogen atom). Each of $R^{74}$ and $R^{75}$ independently represents an alkylene group or an alkylene group having ether linkage. $Z^7$ is one of the groups of —$CON(Y^{71})$—, —$OCON(Y^{71})$— and —$N(Y^{72})CON(Y^{73})$— in which $Y^{71}$, $Y^{72}$ and $Y^{73}$ mean the same as $Y^{61}$, $Y^{62}$ and $Y^{63}$ in the formula (6), respectively.

Examples of the above-mentioned compounds include bis(2-(1-morpholino)ethyl)terephthalamide.

Various surface active agents can improve dispersion stability. Preferred examples of the surface active agents include an anionic surface active agent such as alkylnaphthalene sulfonic acid salt or phosphate ester salt; and a cationic surface active agent such as amine salt; and am amphoteric surface active agent such as aminocarboxylic acid or betaine.

The pigment-dispersing composition generally contains the dispersant (i.e., copolymer of the invention and optionally known dispersant) in an amount of 0.1 to 200 weight parts, preferably 1 to 50 weight parts, based on 100 weight parts of the pigment.

As the dispersion medium, organic solvents are generally used. The amount of the solvent is generally in the range of 10 to 1000 weight parts, preferably 20 to 500 weight parts, based on 100 weight parts of the pigment.

The pigment composition generally contains the pigment in the amount of 5 to 80 wt. %, preferably 10 to 70 wt. %.

Examples of the pigment employable for the invention are as follows.

Yellow pigment: C.I. pigment yellow 20, C.I. pigment yellow 24, C.I. pigment yellow 83, C.I. pigment yellow 86, C.I. pigment yellow 93, C.I. pigment yellow 109, C.I. pigment yellow 110, C.I. pigment yellow 117, C.I. pigment yellow 125, C.I. pigment yellow 137, C.I. pigment yellow 138, C.I. pigment yellow 139, C.I. pigment yellow 185, C.I. pigment yellow 147, C.I. pigment yellow 148, C.I. pigment yellow 153, C.I. pigment yellow 154, C.I. pigment yellow 166, C.I. pigment yellow 168, and C.I. pigment yellow 185;

Orange pigment: C.I. pigment orange 36, C.I. pigment orange 43, C.I. pigment orange 51, C.I. pigment orange 55, C.I. pigment orange 59, and C.I. pigment orange 61;

Red pigment: C.I. pigment red 9, C.I. pigment red 97, C.I. pigment red 122, C.I. pigment red 123, C.I. pigment red 149, C.I. pigment red 168, C.I. pigment red 177, C.I. pigment red 180, C.I. pigment red 192, C.I. pigment red 215, C.I. pigment red 216, C.I. pigment red 217, C.I. pigment red 220, C.I. pigment red 223, C.I. pigment red 224, C.I. pigment red 226, C.I. pigment red 227, C.I. pigment red 228, C.I. pigment red 240, and C.I. pigment red 48:1;

Violet pigment: C.I. pigment violet 19, C.I. pigment violet 23, C.I. pigment violet 29, C.I. pigment violet 30, C.I. pigment violet 37, C.I. pigment violet 40, and C.I. pigment violet 50;

Blue pigment: C.I. pigment blue 15, C.I. pigment blue 15:6, C.I. pigment blue 22, C.I. pigment blue 60, and C.I. pigment blue 64;

Green pigment: C.I. pigment green 7, and C.I. pigment green 36

Brown pigment: C.I. pigment brown 23, C.I. pigment brown 25, and C.I. pigment brown 26; and Black pigment: C.I. pigment black 7.

Among the above-mentioned pigments, pigments having an acidic group (e.g., C.I. pigment yellow 138, C.I. pigment yellow 139, C.I. pigment yellow 185 and C.I. pigment yellow 83) are preferred, and C.I. pigment yellow 138, C.I. pigment yellow 139 and C.I. pigment yellow 185 are particularly preferred.

Using the above-described copolymer as the dispersant, the pigment-dispersing composition of the invention can be prepared, for example, in the following manners.

1) The organic pigment and the dispersant are beforehand mixed to prepare a pigment composition, and then the prepared composition is added to an organic solvent or a vehicle.

2) The organic pigment and the dispersant are independently added to an organic solvent or vehicle.

3) Each of organic pigment and the dispersant is independently added to an organic solvent or vehicle to prepare each dispersion liquid, and then the prepared liquids are mixed. In this case, only the dispersant may be dispersed with a solvent.

4) The organic pigment is added to a solvent or vehicle to prepare a dispersion liquid, and then the dispersant is added to the prepared dispersion liquid.

The term "vehicle" here means a dispersion medium of liquid coating material containing dispersed pigment, and it generally consists of a binder component (with which pigment particles are bound to each other so that the coated film may be hardened) and an organic solvent (in which the binder is dissolved and diluted).

Examples of the dispersing apparatuses used in the above-mentioned preparation method include kneader, roll mill, attriter, supermill, dissolver, homomixer, and sand mill.

The process for forming a color image using the pigment composition comprises, for example, the steps of: coating a substrate with a coating liquid containing the pigment composition, and then drying it to form a layer of the composition; or transferring the composition layer beforehand formed on a temporary support onto the substrate; forming a layer of known positive or negative type photosensitive resin composition on the above formed pigment dispersion composition layer; making the photosensitive resin layer exposed, and developed; and then removing the photosensitive resin composition and the pigment dispersion composition in the unexposed area.

A colored photosensitive composition can be prepared from the pigment composition, and thus prepared photosensitive composition can be used for forming a color image.

The colored photosensitive composition can be prepared by mixing the pigment composition and a photosensitive composition. As the photosensitive compositions, known materials are employable (in fact, almost all the photosensitive compositions disclosed in Japanese Patent Provisional Publication No. H3-282404 are employable). Examples of the photosensitive compositions include a photosensitive composition comprising a negative type diazo resin and a binder; a photopolymerizable composition; a photosensitive composition comprising an azide compound and a binder; and a cinnamic photosensitive composition.

The photopolymerizable composition is particularly preferred. The photopolymerizable composition mainly comprises a photopolymerization initiator, a multifunctional monomer, and a binder. Some photosensitive compositions can be developed with an aqueous alkaline solution, and others can be developed with an organic solvent. The former photosensitive compositions are preferred in consideration of environmental preservation and labor security.

A binder contained in the colored photosensitive composition is required not only to give good dispersion stability to the pigment, but also to suit development with an aqueous alkaline solution. As the binder having such properties as described above, the below-described polymers (which generally have an acidic group) are preferably employed. The polymers practically used can be selected from the following polymers in consideration of pigment dispersibility, compatibility with the multifunctional monomer and the photopolymerization initiator, solubility in alkaline developer, solubility in organic solvents, strength and a softening temperature. The polymers are preferably used in combination with each other.

Examples of the polymers include copolymer of (meth) acrylic acid and (meth)acrylic ester, styrene/maleic anhydride copolymer, and a reaction product of styrene/maleic anhydride copolymer and alcohols. The copolymer of (meth)acrylic acid and (meth)acrylic acid ester is preferred. The weight average molecular weight preferably is in the range of 5,000 to 200,000, in terms of Mw of polystyrene. The colored photosensitive composition preferably contains the binder in an amount of 20 to 80 wt. % of the total solid content.

Examples of the organic solvents employable for the preparation of the colored photosensitive composition include (poly)alkyleneglycol monoalkyl ethers and their acetic acid esters such as ethyleneglycol monomethyl ether, ethyleneglycol monoethyl ether, propyleneglycol monomethyl ether, propyleneglycol monoethyl ether, diethyleneglycol monomethyl ether, and ethyleneglycol monoethyl ether; acetic acid esters such as ethyl acetate, n-propyl acetate, isopropyl acetate, n-butyl acetate, and isobutyl acetate; aromatic hydrocarbons such as benzene, toluene and xylene; ketones such as methyl ethyl ketone, acetone, methyl isobutyl ketone and cyclohexanone; and alcohols such as ethanol, propanol, butanol, hexanol, cyclohexanol, ethylene glycol, diethylene glycol and glycerol. Preferred are alkyleneglycol monoalkyl ethers and their acetic acid esters, acetic acid esters, and methyl ethyl ketone. The amount of the organic solvent preferably is in the range of 50 to 2,000 wt. % of the total solid content. The organic solvents are employable for the preparation of the pigment-dispersing composition, as well as the colored photosensitive composition.

Examples of the multifunctional monomers for the colored photosensitive composition include (meth)acrylic acid ester, urethane (meth)acrylate, (meth)acrylamide, allyl compounds, and vinyl ester. The multi-functional monomers are disclosed in Japanese Patent Provisional Publication No. S60-258539. Preferred is a (meth)acrylic acid ester. The amount of the multi-functional monomer preferably is in the range of 10 to 60 wt. % of the total solid content of the colored photosensitive composition.

The photopolymerization initiator used for the colored photosensitive composition preferably comprises at least one compound having a molecular extinction coefficient of not less than 50 in the wavelength region of 300 to 500 nm. Examples of these compounds include aromatic ketones, lophine dimer, benzoin, benzoin ethers and poly-halogens (Japanese Patent Provisional Publications No. H2-48664, No. H1-152449 and No. H2-153353). Two or more compounds can be used in combination. Examples of the initiators preferably used include a combination of 4,4'-bis (diethylamino)benzophenone and 2-(o-chlorophenyl)-4,5-diphenylimidazole dimer; and 4-[p-N,N-di(ethoxycarbonylmethyl)-2,6-di(trichloromethyl)-s-triazine]. The amount of the photopolymerization initiator preferably is in the range of 0.2 to 10 wt. % of the total solid content of the colored photosensitive composition.

A color image can be formed using the colored photosensitive composition by the process basically comprising the following steps (1)–(3):

(1) well mixing and kneading the dispersant (copolymer of the invention), the organic pigment, and the organic solvent to prepare the pigment dispersion liquid; and then adding the binder monomer soluble in an aqueous alkaline solution, the photopolymerization initiator, and optionally a diluting solvent into the prepared pigment dispersion liquid to prepare the colored photosensitive composition (coating liquid), (2) coating the prepared colored photosensitive composition onto a substrate and drying the coated composition, or transferring the composition layer beforehand formed by coating on a temporary support onto the substrate, to form a colored photosensitive layer, and (3) making the photosensitive layer exposed and developed to form a pattern image.

In the process for production of a color filter of liquid crystal display unit, the above steps (2) and (3) are repeated for the preparation of each color. The process comprising the transferring method is described, for example, in Japanese Patent Provisional Publications No. H4-208940, No. H5-72724, No. H5-80503 and No. H5-173320.

As the substrate, a transparent sheet such as glass plate and transparent plastic plate are generally used. One or more of various commercially available silane coupling agents may be beforehand added to the composition or coated on the substrate so as to enhance the adhesion between the composition layer and the substrate.

The coating liquid of the colored photosensitive composition is coated on the substrate by means of coating means such as spinner, roll coater, bar coater, or curtain coater.

The composition layer beforehand formed on a temporary support is preferably transferred onto the substrate by means of heat roll laminator under atmospheric or reduced pressure.

Examples of the developers include aqueous solutions of alkali metal or alkaline earth metal hydroxide or carbonate, hydrogen carbonate, ammonia, or quaternary ammonium salt. Particularly preferred is an aqueous solution of sodium carbonate.

The present invention is further described by the following non-restrictive working examples.

EXAMPLE 1

A yellow pigment dispersion liquid of the following components were prepared.

| (Components) | |
|---|---|
| C.I. pigment yellow 138 | 8.28 g |
| Copolymer of the invention (the compound of Synthesis example 1) | 8.28 g |
| 1-Methoxy-2-propyl acetate | 63.44 g |

The above components were mixed and kneaded by a motor mill M50 (produced by Eiger) using zirconia beads (diameter: 0.65 mm) at a rotation rate of 9 m/s for 9 hours, to prepare a pigment dispersion liquid.

EXAMPLE 2

The procedure of Example 1 was repeated except for using the compound of Synthesis example 2 in place of that of Synthesis example 1, to prepare a yellow pigment dispersion liquid.

EXAMPLE 3

The procedure of Example 1 was repeated except for using the compound of Synthesis example 3 in place of that of Synthesis example 1, to prepare a yellow pigment dispersion liquid.

EXAMPLE 4

The procedure of Example 1 was repeated except for using the compound of Synthesis example 4 in place of that of Synthesis example 1, to prepare a yellow pigment dispersion liquid.

EXAMPLE 5

The procedure of Example 1 was repeated except for using C.I. pigment yellow 139 in place of C.I. pigment yellow 138, to prepare a yellow pigment dispersion liquid.

EXAMPLE 6

The procedure of Example 1 was repeated except for using the following components of green pigment dispersion liquid in place of that of yellow one, to prepare a green pigment dispersion liquid.

| (Components of green pigment dispersion liquid) | |
|---|---|
| C.I. pigment green 36 | 9.20 g |
| C.I. pigment yellow 138 | 4.96 g |
| Copolymer of the invention (the compound of Synthesis example 1) | 14.16 g |
| 1-methoxy-2-propyl acetate | 51.68 g |

COMPARISON EXAMPLE 1

The procedure of Example 1 was repeated except for using copolymer of dimethylaminoethyl acrylate and methyl methacrylate (weight ratio: 15/85, weight average molecular weight: 20,000) in place of the compound of Synthesis example 1, to prepare a yellow pigment dispersion liquid.

COMPARISON EXAMPLE 2

The procedure of Example 1 was repeated except for using the following copolymer in place of the compound of Synthesis example 1, to prepare a yellow pigment dispersion liquid.

The copolymer was prepared by repeating the procedure of Synthesis example 2 except for using the following monomer solution.

| (Components of monomer solution) | |
|---|---|
| 2-Hydroxyethyl methacrylate | 4.5 weight parts |
| Methacrylic acid | 4.5 weight parts |
| Benzyl methacrylate | 18.0 weight parts |
| Poly(methyl methacrylate) having methacryloyl group at one terminal [number average molecular weight: 6,000, MACROMONOMER AA-6 (trade name), available from Toa Gosei Kagaku Kogyo Co., Ltd.] | 3.0 weight parts |
| 1-Methoxy-2-propyl acetate | 45 weight parts |

Each of the above-prepared pigment dispersion liquids was evaluated in respect of the following characteristics.

(1) Viscosity: Viscosity of the liquid was measured by means of E-type viscometer.
(2) Contrast of image: Contrast of an image given by the liquid was estimated in the following manner:

The pigment dispersion liquid was coated on a glass plate to form a coated layer (thickness: 6 $\mu$m). The plate having the layer was placed between two polarizers. The polarizers were set so that the polarizing axis of each polarizer might be parallel, and then transmittance as measured. In the case that the axes of polarization ere perpendicular to each other, transmittance was also measured. Thereafter, the transmittance ratio was calculated to determine the contrast of image (ref. "Seventh Color Optics Conference (1990)", a color filter for 10.4" size TFT-LCD display of 512 colors, Ueki, Koseki, Fukunaga and Yamanaka).

EXAMPLE 7

(Preparation of green photosensitive composition for color filter)

A photopolymerizable photosensitive composition of the following components was prepared.

| (Components of photopolymerizable photosensitive composition) | |
|---|---|
| Methacrylic acid/benzyl methacrylate copolymer (molar ratio: 28/72, weight average molecular weight: 30,000) | 30 g |
| Pentaerythritol tetracrylate | 7.7 g |
| 4-[p-N,N-Di(ethoxycarbonylmethyl)-2,6-di(trichloromethyl)-s-triazine] | 0.3 g |
| Hydroquinone monomethyl ether | 0.01 g |
| 1-Methoxy-2-propyl acetate | 62 g |

To the prepared photosensitive composition, 45 g of a pigment dispersion liquid of C.I. pigment green 36 dispersed in 1-methoxy-2-propyl acetate (solid content: 33%) and 40 g of the yellow pigment dispersion liquid of Example 1 (for color compensation) were added to prepare a green photosensitive composition for color filter.

EXAMPLE 8

The procedure of Example 7 was repeated except for using the yellow pigment dispersion liquid of Example 2 in place of that of Example 1, to prepare a green photosensitive composition for color filter.

EXAMPLE 9

The procedure of Example 7 was repeated except for using the yellow pigment dispersion liquid of Example 3 in place of that of Example 1, to prepare a green photosensitive composition for color filter.

EXAMPLE 10

The procedure of Example 7 was repeated except for using the yellow pigment dispersion liquid of Example 4 in place of that of Example 1, to prepare a green photosensitive composition for color filter.

EXAMPLE 11

The procedure of Example 7 was repeated except for using the yellow pigment dispersion liquid of Example 5 in place of that of Example 1, to prepare a green photosensitive composition for color filter.

EXAMPLE 12

The procedure of Example 7 was repeated except for using 85 g of the green pigment dispersion liquid of Example 6 in place of 45 g of that prepared in Example 7 and 40 g of the yellow pigment dispersion liquid of Example 1, to prepare a green photosensitive composition for color filter.

COMPARISON EXAMPLE 3

The procedure of Example 7 was repeated except for using the yellow pigment dispersion liquid of Comparison Example 1 in place of that of Example 1, to prepare a green photosensitive composition for color filter.

[Evaluation]

With respect to each above-prepared green photosensitive composition for color filter, the viscosity was measured in the same manner as described above.

Further, a color filter was prepared from each photosensitive composition in the following manner:

The photosensitive composition was coated on a glass plate by means of spinner, and dried at 100° C. for 2 minutes to form a film (thickness: about 2 μm). In a stream of nitrogen gas, the film was exposed to light coming from ultra-high pressure mercury lamp and then developed with 1% aqueous solution of sodium carbonate to prepare a color filter.

The contrast of an image given by the prepared filter was estimated in the manner described above.

The results are shown in Table 1.

TABLE 1

| | | Contrast | |
|---|---|---|---|
| | Viscosity (cp) | pigment dispersion | photosensitive composition |
| Ex. 1 | 40 | 300 | — |
| Ex. 2 | 90 | 270 | — |
| Ex. 3 | 100 | 250 | — |
| Ex. 4 | 45 | 380 | 1300 |
| Ex. 5 | 150 | 250 | — |
| Ex. 6 | 70 | 1300 | — |
| Ex. 7 | 70 | — | 1250 |
| Ex. 8 | 70 | — | 1100 |
| Ex. 9 | 70 | — | 1200 |
| Ex. 10 | 70 | — | 1350 |
| Ex. 11 | 70 | — | 1350 |
| Ex. 12 | 70 | — | 1300 |
| C. Ex. 1 | more than 1200 | 150 | — |
| C. Ex. 2 | too viscous* | — | — |
| C. Ex. 3 | 200 | — | 500 |

Remarks*: the liquid of Comparison Example 2 was too viscous to disperse the pigment.

The results set forth in Table 1 indicate that the pigment dispersion liquid containing the copolymer (dispersant) of the invention shows a low viscosity and that the color filter prepared from the colored photosensitive composition of the invention gives an image of high contrast. This fact suggests that the pigment particles are dispersed finely enough to give an image of high contrast.

The pigment dispersion composition of the invention has excellent properties such as a high dispersion stability, a high fluidity, and a high coloring power. Further, the colored photosensitive composition of the invention is favorable for development with an alkaline developer and shows a high coloring power or a high contrast to form a color image of a high quality.

What is claimed is:

1. A colored photosensitive composition which comprises a pigment composition, a binder polymer having an acidic group, a multi-functional monomer having at least two ethylenic unsaturated double bonds, and a photopolymerization initiator, said pigment composition comprising an organic pigment, a dispersant, and an organic solvent, wherein the dispersant is a copolymer of a polymerizable oligomer having an ethylenic unsaturated double bond at its terminal position and one or more monomers at least one of which has a nitrogen-containing group and an ethylenic unsaturated double bond.

2. The colored photosensitive composition of claim 1, wherein the copolymer comprises repeating units derived from the polymerizable oligomer in an amount of 20 to 99 wt. % of the total repeating units, and repeating units derived from the monomer or monomers in an amount of 1 to 40 wt. % of the total repeating units.

3. The colored photosensitive composition of claim 1, wherein the copolymer is a copolymer of a polymerizable oligomer having an ethylenic unsaturated double bond in its terminal position and two or more monomers at least one of which has a nitrogen-containing group and an ethylenic unsaturated double bond and other of which has an ethylenic unsaturated double bond and has no nitrogen-containing group.

4. The colored photosensitive composition of claim 1, wherein the polymerizable oligomer is a poly(alkyl acrylate), a copolymer of an alkyl acrylate and a copolymerizable monomer, a poly(alkyl methacrylate), a copolymer of an alkyl methacrylate and a copolymerizable monomer, or polystyrene, any of which has a number average molecular weight of 1,000 to 10,000 and has an acryloyl or methacryloyl group in its terminal position.

5. The colored photosensitive composition of claim 1, wherein the monomer having a nitrogen-containing group and an ethylenic unsaturated double bond is a compound of the following formula (1):

(1)

in which $R^{11}$ represents hydrogen atom or methyl group; $R^{12}$ represents an alkylene group of 1 to 8 carbon atoms; $X^1$ represents —$N(R^{13})(R^{14})$ in which each of $R^{13}$ and $R^{14}$ independently is hydrogen atom, an alkyl group of 1 to 6 carbon atoms, or phenyl group, —$R^{15}$—$N(R^{16})(R^{17})$ in which $R^{15}$ is an alkylene group of 1 to 6 carbon atoms and each of $R^{16}$ and $R^{17}$ independently is hydrogen atom, an alkyl group of 1 to 6 carbon atoms, or phenyl group, or a heterocyclic group selected from the group consisting of pyrrolidino, pyrrolidyl, pyridyl, piperidino or morpholino; and each of m and n independently is 0 or 1.

6. The colored photosensitive composition of claim 1, wherein the organic pigment is an acidic yellow pigment.

7. The colored photosensitive composition of claim 1, wherein the monomer having a nitrogen-containing group and an ethylenic unsaturated double bond is an aminoalkyl acrylamide or an aminoalkyl methacrylamide.

8. The colored photosensitive composition of claim 1, wherein the polymerizable oligomer has a number average molecular weight of 1,000 to 10,000.

9. The colored photosensitive composition of claim 1, wherein the copolymer comprises a linear polymer chain formed of one or more monomers at least one of which has a nitrogen-containing group and an ethylenic unsaturated double bond and a macromonomer chain which is derived from the oligomer having an ethylenic unsaturated double bond at its terminal position and which is attached to the linear polymer chain at its one end.

* * * * *